United States Patent
Oshima et al.

(10) Patent No.: US 12,399,503 B2
(45) Date of Patent: Aug. 26, 2025

(54) CONTROL METHOD, TRANSPORT SYSTEM, AND COMMUNICATION DEVICE

(71) Applicant: MURATA MACHINERY, LTD., Kyoto (JP)

(72) Inventors: Munekuni Oshima, Ise (JP); Yasuhisa Ito, Ise (JP); Tetsuya Kuwahara, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 1186 days.

(21) Appl. No.: 17/277,777

(22) PCT Filed: Aug. 30, 2019

(86) PCT No.: PCT/JP2019/034120
§ 371 (c)(1),
(2) Date: Mar. 19, 2021

(87) PCT Pub. No.: WO2020/066458
PCT Pub. Date: Apr. 2, 2020

(65) Prior Publication Data
US 2021/0349472 A1 Nov. 11, 2021

(30) Foreign Application Priority Data

Sep. 27, 2018 (JP) .................... 2018-182584

(51) Int. Cl.
*G05D 1/02* (2020.01)
*G05D 1/00* (2006.01)
(Continued)

(52) U.S. Cl.
CPC ......... *G05D 1/0276* (2013.01); *G05D 1/0225* (2013.01); *H01L 21/67259* (2013.01);
(Continued)

(58) Field of Classification Search
CPC ............... G05D 1/0225; G05D 1/0276; H01L 21/67259; H01L 21/67733;
(Continued)

(56) References Cited

U.S. PATENT DOCUMENTS 7,668,562 B1 * 2/2010 Longaker ............ H04W 52/243
455/13.1
2005/0159854 A1 7/2005 Hori et al.
(Continued)

FOREIGN PATENT DOCUMENTS

JP 2010-245782 A 10/2010
JP 2015-082574 A 4/2015
(Continued)

OTHER PUBLICATIONS

Official Communication issued in corresponding European Patent Application No. 19865946.8, mailed on May 3, 2023.
(Continued)

*Primary Examiner* — Mark A Connolly
(74) *Attorney, Agent, or Firm* — Keating & Bennett, LLP (57) ABSTRACT

In a control method, a controller obtains equipment specifying information that specifies an equipment to which a transportable object is to be delivered, and a transport carriage obtains carriage position information indicating the position of the transport carriage. Any one of the transport carriage, a specific communication device, and the controller calculates the distance between the transport carriage and the specific communication device based on delivery position information indicating the position of a specific equipment and the carriage position information, and determines whether the distance is not more than a predetermined distance. When the distance is not more than the predetermined distance, one of the transport carriage and the specific communication device transmits, wirelessly to the surroundings, a trigger signal to start wireless communication between the transport carriage and the specific equipment, and performs wireless communication to deliver the transportable object between the transport carriage and the specific equipment.

9 Claims, 7 Drawing Sheets

(51) Int. Cl.
*H01L 21/67* (2006.01)
*H01L 21/677* (2006.01)

(52) U.S. Cl.
CPC .. *H01L 21/67294* (2013.01); *H01L 21/67733* (2013.01); *H01L 21/67736* (2013.01)

(58) Field of Classification Search
CPC ............ H01L 21/67736; H04W 28/02; H04W 28/0226; H04W 28/0236
See application file for complete search history.

(56) References Cited

U.S. PATENT DOCUMENTS

| | | | |
|---|---|---|---|
| 2006/0045066 A1* | 3/2006 | Choi | H04W 40/08 370/351 |
| 2007/0025388 A1* | 2/2007 | Abhishek | H04L 1/188 370/447 |
| 2007/0153731 A1* | 7/2007 | Fine | H04B 17/336 370/329 |
| 2014/0334473 A1* | 11/2014 | Zhang | H04B 7/0626 370/338 |
| 2015/0269107 A1 | 9/2015 | Tanimoto et al. | |
| 2015/0316924 A1 | 11/2015 | Oh et al. | |
| 2017/0283182 A1 | 10/2017 | Maejima et al. | |
| 2018/0351941 A1* | 12/2018 | Chhabra | H04L 63/08 |

FOREIGN PATENT DOCUMENTS

| | | |
|---|---|---|
| JP | 6036842 B2 | 12/2016 |
| JP | 2018-142859 A | 9/2018 |
| KR | 10-0801931 B1 | 2/2008 |
| KR | 10-1527686 B1 | 6/2015 |
| KR | 10-2017-0113029 A | 10/2017 |
| WO | 2018/043245 A1 | 3/2018 |

OTHER PUBLICATIONS

Official Communication issued in corresponding European Patent Application No. 19865946.8, mailed on May 20, 2022.

* cited by examiner

CONTROL METHOD, TRANSPORT SYSTEM, AND COMMUNICATION DEVICE

BACKGROUND OF THE INVENTION

1. Field of the Invention

The present invention relates to a control method of a transport system, a transport system, and a communication device.

2. Description of the Related Art

Japanese Unexamined Patent Application Publication No. 2015-82574 discloses a transport system including: a plurality of overhead travelling transport carriages each transporting a FOUP (Front Opening Unified Pod) in which a semiconductor wafer is stored; and a plurality of semiconductor manufacturing apparatuses for processing a wafer. Each semiconductor manufacturing apparatus includes a set of a communication device and an access point attached to the apparatus. Each semiconductor manufacturing apparatus is provided with a load port onto which the FOUP is loaded. The communication device is connected to the load port with a parallel cable and also connected to the access point with a LAN (Local Area Network) cable. The access point is wirelessly communicable with each transport carriage.

SUMMARY OF THE INVENTION

In the aforementioned transport system, each communication device continues to wirelessly transmit a trigger signal (for example, a beacon) for constantly searching surrounding areas for a communication partner through the access point. When approaching a semiconductor manufacturing apparatus onto which a FOUP is to be loaded, the transport carriage responds to the trigger signal from the communication device attached to the semiconductor manufacturing apparatus. The carriage and the communication device then start wireless communication (interlock communication) to perform a process of transferring a transportable object between the load port and the transport carriage (the interlock process is defined in the SEMI E84 standard).

However, when each of adjacent communication devices continues to transmit the trigger signal constantly, the trigger signals may interfere with each other, causing communication failure.

Accordingly, preferred embodiments of the present invention provide control methods and transport systems each capable of reducing or preventing the occurrence of communication failure in the transport systems.

A control method of a transport system according to an aspect of a preferred embodiment of the present invention is a control method of a transport system, the transport system including a transport carriage to transport a transportable object, a plurality of communication devices respectively connected to a plurality of equipment to which the transportable object is to be delivered, and a controller to control travel of the transport carriage, the control method including: obtaining, by the controller, equipment specifying information specifying a specific equipment to which the transport carriage is to deliver the transportable object, the specific equipment being included in the plurality of equipment; obtaining, by the transport carriage, carriage position information indicating the position of the transport carriage; calculating, by any one of the transport carriage, a specific communication device which is connected to the specific equipment specified in the equipment specifying information, and the controller, a distance between the transport carriage and the specific communication device based on delivery position information indicating a position of the specific equipment and the carriage position information, the specific communication device being included in the plurality of communication devices; determining, by any one of the transport carriage, the specific communication device, and the controller, whether the distance is less than or equal to a predetermined distance; transmitting, by one of the transport carriage and the specific communication device, a trigger signal wirelessly to surroundings, when the distance is less than or equal to a predetermined distance, the trigger signal being a signal to start wireless communication between the transport carriage and the specific equipment; and performing, by the transport carriage and the specific equipment, wireless communication to deliver the transportable object between the transport carriage and the specific equipment, when the trigger signal is communicated wirelessly between the transport carriage and the specific equipment.

According to the control method, when the distance between the transport carriage and the specific communication device is less than or equal to a predetermined distance, one of the transport carriage and the specific communication device transmits a trigger signal. Accordingly, each of a plurality of communication devices does not need to continuously transmit the trigger signal. As a result, mutual interference of trigger signals caused by a plurality of communication devices transmitting trigger signals does not occur. In this way, according to the control method, it is possible to reduce or prevent the occurrence of communication failure in the transport system.

Furthermore, the control method may further include: obtaining, by the transport carriage, the delivery position information by receiving, from the controller, a travel instruction instructing travelling up to the position of the specific equipment, wherein the calculating of the distance may include calculating, by the transport carriage, the distance based on the delivery position information obtained and the carriage position information, the determining may include determining, by the transport carriage, whether the distance is less than or equal to the predetermined distance, and the transmitting of the trigger signal may include transmitting, by the transport carriage, the trigger signal wirelessly to the surroundings, when the distance is determined to be less than or equal to the predetermined distance.

Accordingly, each of a plurality of communication devices does not necessarily need to have a function to transmit the trigger signal. For this reason, according to the control method, it is possible to apply the control method to a transport system including a communication device that does not have a function to transmit the trigger signal.

Furthermore, the plurality of communication devices may each store an identifier that uniquely identifies the communication device, the transmitting of the trigger signal may include transmitting, by the transport carriage, the trigger signal including a specific identifier that identifies the specific communication device, to the surroundings, and the performing of the wireless communication may include: specifying, by the specific communication device, the transport carriage as a communication partner by verifying that the specific identifier is included in the trigger signal; and performing, by the transport carriage and the specific communication device, the wireless communication based on the specifying.

Accordingly, the specific communication device verifies an identifier that identifies the communication device included in the trigger signal, and then recognizes that the communication device included in the trigger signal is the specific communication device. For this reason, according to the control method, the transport carriage and the specific communication device can relatively easily perform wireless communication to deliver the transportable object between the transport carriage and the specific equipment.

Furthermore, the system may further include a relay device that relays wireless communication between the transport carriage and the plurality of communication devices, the control method may further include: obtaining, by the transport carriage, the delivery position information by receiving, from the controller, a travel instruction instructing travelling up to the position of the specific equipment, the calculating of the distance may include calculating, by the transport carriage, the distance based on the delivery position information obtained and the carriage position information, the determining may include determining, by the transport carriage, whether the distance is less than or equal to the predetermined distance, the control method may further include: transmitting, by the transport carriage, a transmission instruction wirelessly to the specific communication device via the relay device, when the distance is determined to be less than or equal to the predetermined distance, the transmission instruction instructing transmission of the trigger signal, and the transmitting of the trigger signal includes transmitting, by the specific communication device, the trigger signal wirelessly to the surroundings, when the transmission instruction is received.

Accordingly, the transport carriage does not necessarily need to have a function to transmit the trigger signal. For this reason, according to the control method, it is possible to apply the control method to a transport system including a transport carriage that does not have a function to transmit the trigger signal.

Furthermore, the plurality of communication devices may each store an identifier that uniquely identifies the communication device, the transport carriage may store correspondence information indicating correspondence between the plurality of communication devices and the identifiers, the transmitting of the trigger signal may include transmitting, by the specific communication device, the trigger signal including a specific identifier that identifies the specific communication device, wirelessly to the surroundings, and the performing of the wireless communication may include: specifying, by the transport carriage, the specific communication device as a communication partner based on the specific identifier included in the trigger signal and the correspondence information; and performing, by the transport carriage and the specific communication device, the wireless communication based on the specifying.

Accordingly, the transport carriage uses an identifier included in the trigger signal to specify the specific communication device as a communication partner. For this reason, according to the control method, the transport carriage and the specific communication device can relatively easily perform wireless communication to deliver the transportable object between the transport carriage and the specific equipment.

A transport system according to an aspect of a preferred embodiment of the present invention includes: a transport carriage to transport a transportable object; a plurality of communication devices respectively connected to a plurality of equipment to which the transportable object is to be delivered; and a controller to control travel of the transport carriage, wherein the controller obtains equipment specifying information specifying a specific equipment to which the transport carriage is to deliver the transportable object, the specific equipment being included in the plurality of equipment; the transport carriage obtains carriage position information indicating the position of the transport carriage; any one of the transport carriage, a specific communication device which is connected to the specific equipment specified in the equipment specifying information, and the controller calculates a distance between the transport carriage and the specific communication device based on delivery position information indicating a position of the specific equipment and the carriage position information, the specific communication device being included in the plurality of communication devices; any one of the transport carriage, the specific communication device, and the controller determines whether the distance is less than or equal to a predetermined distance; one of the transport carriage and the specific communication device transmits a trigger signal wirelessly to surroundings, when the distance is less than or equal to a predetermined distance, the trigger signal being a signal to start wireless communication between the transport carriage and the specific equipment; and the transport carriage and the specific equipment perform wireless communication to deliver the transportable object between the transport carriage and the specific equipment, when the trigger signal is communicated wirelessly between the transport carriage and the specific equipment.

According to the transport system, when the distance between the transport carriage and the specific communication device is less than or equal to a predetermined distance, one of the transport carriage and the specific communication device transmits a trigger signal. Accordingly, each of a plurality of communication devices does not need to continuously transmit the trigger signal. As a result, mutual interference of trigger signals caused by a plurality of communication devices transmitting trigger signals does not occur. In this way, according to the transport system, it is possible to reduce or prevent the occurrence of communication failure in the transport system.

Furthermore, the transport carriage may obtain the delivery position information by receiving, from the controller, a travel instruction instructing travelling up to the position of the specific equipment, the transport carriage may calculate the distance based on the delivery position information obtained and the carriage position information, the transport carriage may determine whether the distance is less than or equal to the predetermined distance, and the transport carriage may transmit the trigger signal wirelessly to the surroundings, when the distance is determined to be less than or equal to the predetermined distance.

Accordingly, each of a plurality of communication devices does not necessarily need to have a function to transmit the trigger signal. For this reason, according to the transport system, it is possible to include a communication device that does not have a function to transmit the trigger signal.

Furthermore, the plurality of communication devices may each store an identifier that uniquely identifies the communication device, the transport carriage may transmit, to the surroundings, the trigger signal including a specific identifier that identifies the specific communication device, and the specific communication device may specify the transport carriage as a communication partner by verifying that the specific identifier is included in the trigger signal, and the transport carriage and the specific communication device may perform the wireless communication based on the specifying.

Accordingly, the specific communication device verifies an identifier that identifies the communication device included in the trigger signal, and then recognizes that the communication device included in the trigger signal is the specific communication device. For this reason, according to the transport system, the transport carriage and the specific communication device can relatively easily perform wireless communication to deliver the transportable object between the transport carriage and the specific equipment.

Furthermore, the transport system may further include a relay device that relays wireless communication between the transport carriage and the plurality of communication devices, wherein the transport carriage may obtain the delivery position information by receiving, from the controller, a travel instruction instructing travelling up to the position of the specific equipment, the transport carriage may calculate the distance based on the delivery position information obtained and the carriage position information, the transport carriage may determine whether the distance is less than or equal to the predetermined distance, the transport carriage may transmit a transmission instruction wirelessly to the specific communication device via the relay device, when the distance is determined to be less than or equal to the predetermined distance, the transmission instruction instructing transmission of the trigger signal, and the specific communication device may transmit the trigger signal wirelessly to the surroundings, when the transmission instruction is received.

Accordingly, each of a plurality of communication devices does not necessarily need to have a function to transmit the trigger signal. For this reason, according to the transport system, it is possible to apply the control method to a transport system including a transport carriage that does not have a function to transmit the trigger signal.

Furthermore, the plurality of communication devices may each store an identifier that uniquely identifies the communication device, the transport carriage may store correspondence information indicating correspondence between the plurality of communication devices and the identifiers, the specific communication device may transmit, wirelessly to the surroundings, the trigger signal including a specific identifier that identifies the specific communication device, and the transport carriage may specify the specific communication device as a communication partner based on the specific identifier included in the trigger signal and the correspondence information, and the transport carriage and the specific communication device may perform the wireless communication based on the specifying.

Accordingly, the transport carriage uses an identifier included in the trigger signal to specify the specific communication device as a communication partner. For this reason, according to the transport system, the transport carriage and the specific communication device can relatively easily perform wireless communication to deliver the transportable object between the transport carriage and the specific equipment.

A communication device according to an aspect of a preferred embodiment of the present invention is a communication device connected to a specific equipment to which a transportable object is to be delivered, the communication device transmitting, wirelessly to surroundings, a trigger signal to start wireless communication between a transport carriage to transport the transportable object and the specific equipment, when a transmission instruction instructing transmission of the trigger signal is received from the transport carriage via a relay device that relays wireless communication between the transport carriage and the communication device.

The communication device transmits the trigger signal when a transmission instruction is received. Accordingly, the communication device does not need to continuously transmit the trigger signal. Accordingly, using the communication device in a transport system including a plurality of communication devices, mutual interference of trigger signals caused by each of a plurality of communication devices transmitting the trigger signal does not occur. In this way, according to the communication device, it is possible to reduce or prevent the occurrence of communication failure.

Furthermore, the communication device may: store an identifier that uniquely identifies the communication device; when transmitting the trigger signal, transmit, wirelessly to the surroundings, the trigger signal including the identifier stored; and when the transport carriage specifies the communication device as a communication partner based on the identifier included in the trigger signal received, perform, with the transport carriage, wireless communication to deliver the transportable object between the transport carriage and the specific equipment.

Accordingly, the transport carriage uses an identifier included in the trigger signal to specify the communication device as a communication partner. Accordingly, according to the communication device, wireless communication to deliver the transportable object between the transport carriage and the specific equipment can be performed relatively easily with the transport carriage.

According to control methods and transport systems of preferred embodiments of the present invention, it is possible to reduce or prevent the occurrence of communication failure in the transport system.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, preferred embodiments of the present invention will be specifically described with reference to the drawings.

Each of the following preferred embodiments is a preferred specific example of the present invention. The numerical values, shapes, materials, structural components, the arrangement and connection of the structural components, steps, the processing order of the steps, etc., shown in the following preferred embodiments are mere examples, and thus are not intended to limit the present invention. Furthermore, among the structural components described in the following preferred embodiments, structural components not recited in any one of the independent claims that indicate the broadest concepts are described as optional structural components. Moreover, there are cases where the same reference signs are assigned to the same structural elements, and description is omitted.

Preferred Embodiment 1

A transport system to transport a transportable object will now be described.

Figure 1:
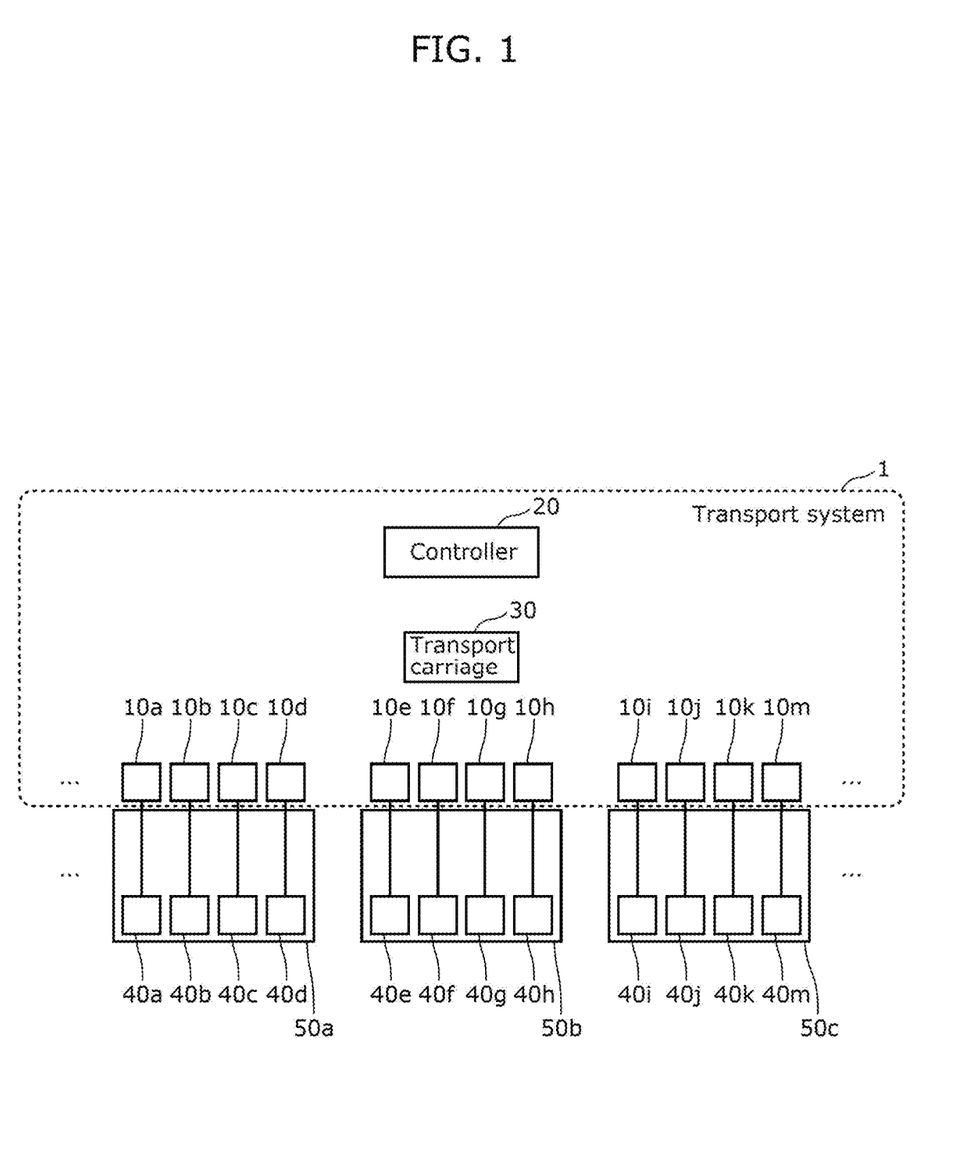
FIG. 1 is a configuration diagram of a transport system according to Preferred Embodiment 1 of the present invention.

FIG. 1 is a configuration diagram of transport system 1 according to Preferred Embodiment 1.

As illustrated in FIG. 1, transport system 1 includes transport carriage 30 to transport a transportable object, a plurality of communication devices 10a to 10k and 10m connected to a plurality of equipment 40a to 40k and 40m to which the transportable object is to be delivered, and controller 20 configured or programmed to control the travel of transport carriage 30.

As an example, transport system 1 is operated in a semiconductor fab equipped with semiconductor manufacturing apparatuses 50a to 50c as a transport system to transport a FOUP in which a semiconductor wafer is stored as a transportable object.

Hereinafter, communication devices 10a to 10k and 10m are referred to as communication device 10 unless it is necessary to explicitly distinguish each of them individually for explanation. Pieces of equipment 40a to 40k and 40m are referred to as equipment 40 unless it is necessary to explicitly distinguish each of them individually for explanation. Semiconductor manufacturing apparatuses 50a to 50c are referred to as semiconductor manufacturing apparatus 50 unless it is necessary to explicitly distinguish each of them individually for explanation.

Note that although transport system 1 is described here as lacking both equipment 40 and semiconductor manufacturing apparatus 50, transport system 1 may include one or both of equipment 40 and semiconductor manufacturing apparatus 50. FIG. 1 illustrates as if there is one transport carriage 30. However, there may be a plurality of transport carriages 30.

Figure 2:
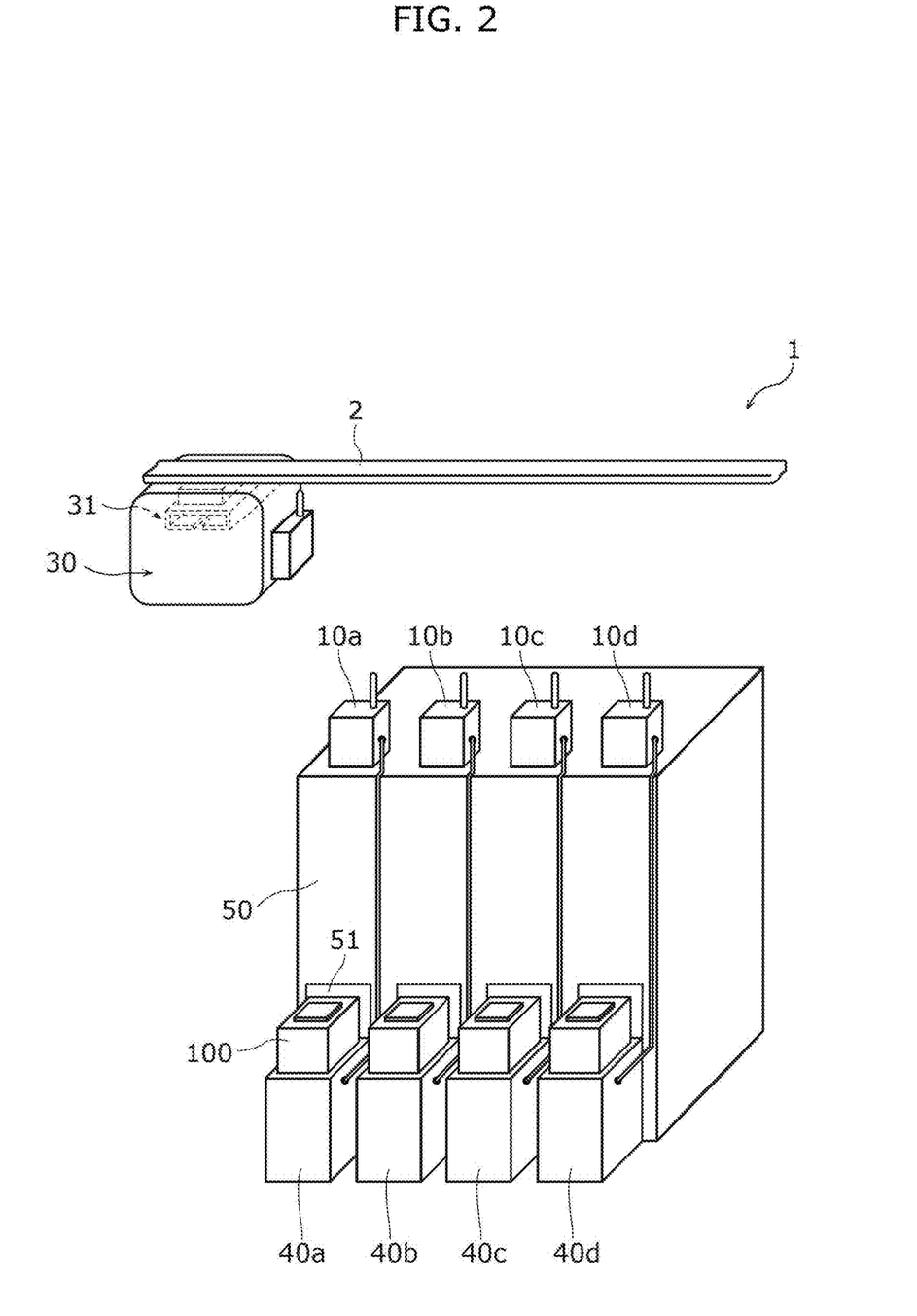
FIG. 2 is an external view illustrating an outline of a transport system according to Preferred Embodiment 1 of the present invention.

FIG. 2 is an external view illustrating an outline of transport system 1 according to Preferred Embodiment 1.

Semiconductor manufacturing apparatus 50 illustrated in FIG. 2 is an apparatus for processing semiconductor wafers, and includes FOUP intake/discharge port 51 for taking-in and discharging a FOUP. The FOUP is transportable object 100.

Equipment 40 is a load port on which the FOUP, which is transportable object 100, is to be loaded and disposed near FOUP intake/discharge port 51 of semiconductor manufacturing apparatus 50 for delivery of transportable object 100 with (i.e., between equipment 40 and) transport carriage 30 and with (i.e., between equipment 40 and) semiconductor manufacturing apparatus 50.

Equipment 40 transmits and receives a signal through a hard-wired cable with communication device 10. Here, 4 pieces of equipment 40 are provided per one semiconductor manufacturing apparatus 50, for example, and each piece of equipment 40 is connected to one communication device 10 one by one. As a result, one semiconductor manufacturing apparatus 50 is connected to a plurality (for example, 4) of communication devices 10 through multiple (for example, 4) pieces of equipment 40.

In Preferred Embodiment 1, equipment 40 is described as being connected to communication device 10 one by one. In another configuration, however, the number of communication devices 10 may be reduced by, for example, 2 to 1 connection in such a manner that equipment 40a and equipment 40b are connected to communication device 10a and equipment 40c and equipment 40d of equipment 40 are connected to communication device 10b. In this way, cost reduction of the entire transport system can be achieved.

Transport carriage 30 is a carriage that achieves delivery of transportable object 100 with equipment 40 and transports transportable object 100 along travel route 2. The inside of transport carriage 30 is provided with gripper 31 to grip transportable object 100. Gripper 31 is, for example, able to be moved up and down and moved down near equipment 40 when transferring transportable object 100 to and from equipment 40. Gripper 31 may be movable horizontally.

Communication device 10 is a device including a communication function to relay transmission and reception (hereinafter referred to as "interlock communication") of a signal, specifically a signal related to an interlock process (hereinafter referred to as "interlock signal") communicated between equipment 40 and transport carriage 30 to deliver transportable object. The interlock signal is a packet, for example. The interlock process refers to a process that requires a specific condition to be met for another operation to be performed. The interlock process may be a process defined in SEMI E84 standard, for example. By implementing the interlock process in transport system 1, it is possible to prevent advancement to the next step unless a specific condition is met when transportable object 100 is to be transferred from transport carriage 30 to equipment 40. The specific condition includes, for example, the case in which, a specific transport carriage 30 transmits, to a specific equipment 40 to which the specific transport carriage 30 wants to deliver transportable object 100, an interlock signal including an instruction (execution command for interlock process) to cause the specific equipment 40 to verify whether it is currently ready for delivery of transportable object 100, and successfully receives, from the specific equipment 40, an interlock signal including a response that indicates that the specific equipment 40 is ready for transfer. In this way, transportable object 100 can safely and reliably be delivered from the specific transport carriage 30 to the specific equipment 40.

In relaying interlock communication between equipment 40 and transport carriage 30, communication device 10 performs communication between communication device 10 and transport carriage 30 wirelessly and between communication device 10 and equipment 40 via a hard-wired cable. Here, as wireless communication, it is possible to adopt, for example, communication that is compliant with standards such as the IEEE802.11a, b, g, n standards and the ANT communication standard used in the ISM band communication, and the Sub Giga frequency band communication.

Wired communication may be, for example, by adopting communications such as the IEEE802.3 standard, parallel communication, and serial communication.

Components of transport system 1 will now be described in detail.

Figure 3:
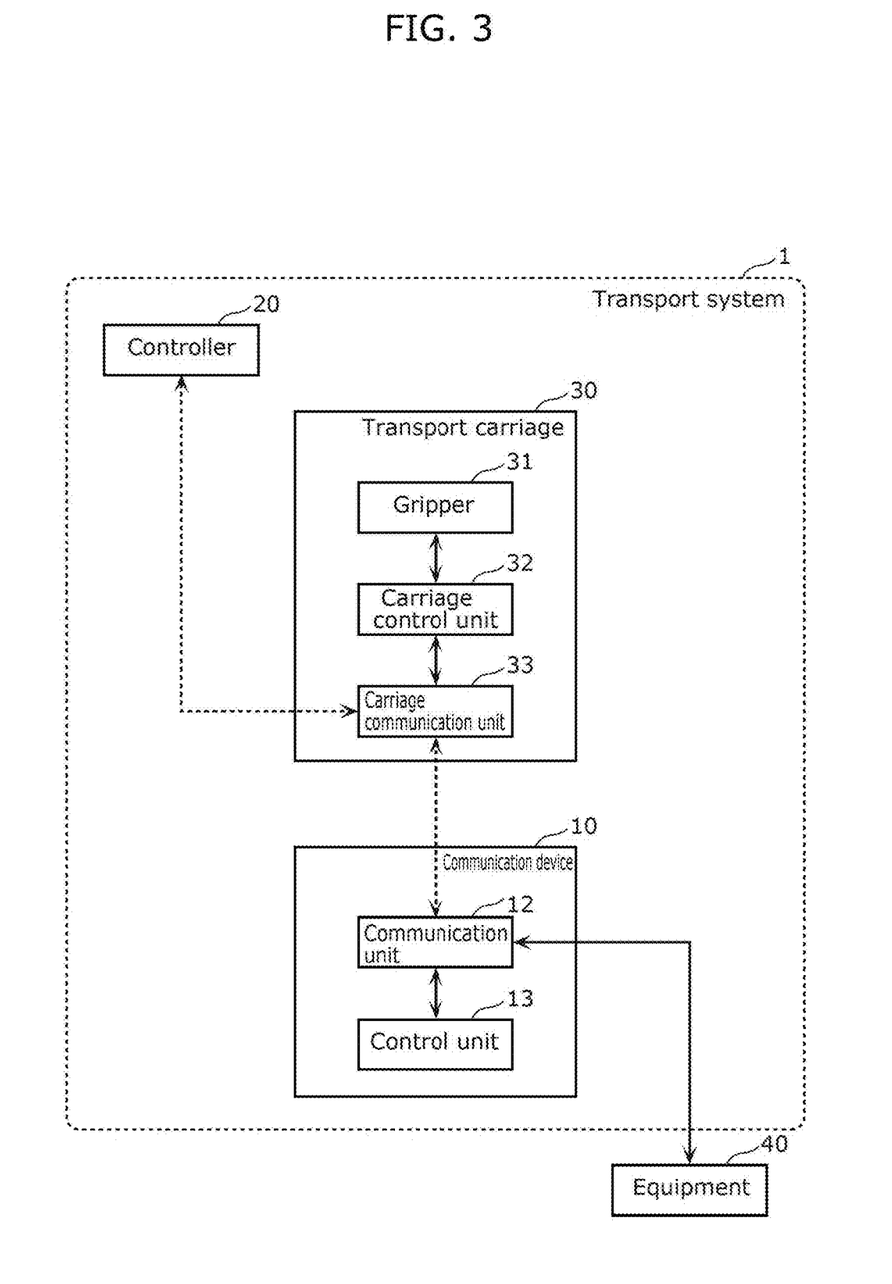
FIG. 3 is a block diagram illustrating a functional configuration of a transport system according to Preferred Embodiment 1 of the present invention.

FIG. 3 is a block diagram illustrating a functional configuration of transport system 1.

Controller 20 controls travel of transport carriage 30. Controller 20 uses, for example, a leaky feeder line extending along travel route 2 on which transport carriage 30 travels (FIG. 2) to communicate with transport carriage 30 in a contactless manner and transmits various control signals to transport carriage 30 to control travel of transport carriage 30. Communication between controller 20 and transport carriage 30 is achieved in a contactless manner, may superimpose a control signal on an electric power supplied on a litz wire extending along travel route 2.

Controller 20 obtains equipment specifying information specifying equipment 40 to which transport carriage 30 is to deliver transportable object 100 from an external device (for example, a management server of a management system that manages semiconductor manufacturing processes in a semiconductor manufacturing plant where transport system 1 is operated).

Once the equipment specifying information is obtained, controller 20 transmits, to transport carriage 30, a travel instruction instructing transport carriage 30 to travel to the position of the specific equipment 40 specified by equipment specifying information.

Controller 20 may be implemented by, for example, a computer device including a processor, a memory, and a communication interface. In this case, various functions of controller 20 are achieved by the processor executing a program stored in the memory.

Transport carriage 30 includes gripper 31, carriage control unit 32, and carriage communication unit 33.

Carriage communication unit 33 communicates with communication device 10 and controller 20. Carriage communication unit 33 communicates wirelessly with communication device 10 and communicates with controller 20 in a contactless manner.

Carriage communication unit 33 preferably includes at least two operation modes: a master station mode in which carriage communication unit 33 transmits a trigger signal (for example, beacon, pairing signal) to the outside; and a slave station mode in which carriage communication unit 33 does not transmit a trigger signal to the outside. The operation mode of carriage communication unit 33 is set to either the master station mode or the slave station mode by carriage control unit 32. The operation mode of carriage communication unit is normally set to the slave station mode except in a special time period when a predetermined condition is met.

Carriage control unit 32 controls transport carriage 30.

Carriage control unit 32 obtains carriage position information indicating the position of transport carriage 30. For example, carriage control unit 32 may include a barcode reader and obtain carriage position information on travel route 2 by reading barcodes along travel route 2 at a predetermined interval (for example, 3 meters). In this case, when transport carriage 30 is located somewhere between the barcodes, carriage control unit 32 may obtain carriage position information by using an encoded signal output from a driving device (for example, a motor) that drives transport carriage 30 to travel to interpolate the position between the barcodes.

Carriage control unit 32 receives a travel instruction transmitted from controller 20 via carriage communication unit 33 and obtains delivery position information indicating the position of the specific equipment 40 to which transport carriage 30 is to deliver transportable object 100.

Carriage control unit 32 calculates a distance between transport carriage 30 and a specific communication device 10 connected to the specific equipment 40, specifically a distance between transport carriage 30 and the specific communication device 10 along travel route 2 based on the obtained carriage position information and the obtained delivery position information, and determines whether the calculated distance is less than or equal to a predetermined distance. The distance between transport carriage 30 and the specific communication device 10 may be a linear distance connecting the two. Here, since the specific communication device 10 and the specific equipment 40 are located at the same or substantially the same position, carriage control unit 32 may consider the distance between the specific equipment and transport carriage 30 as the distance between the specific communication device 10 and transport carriage 30.

When it is determined that the calculated distance is less than or equal to a predetermined distance, carriage control unit 32 sets the operation mode of carriage communication unit 33 to the master station mode. Carriage control unit 32 then transmits a trigger signal to start the interlock communication, which is wireless communication, between transport carriage 30 and the specific equipment 40 wirelessly to surroundings via carriage communication unit 33. The trigger signal includes an identifier that identifies the specific communication device 10. Here, the identifier is an identifier assigned to each of a plurality of communication devices 10 to uniquely identify each of a plurality of communication devices 10. When the wireless communication is, for example, one that is compliant with the IEEE802.11 standard, the identifier may be an SSID (Service Set Identifier) identifying a network. Similarly, when the wireless communication is, for example, one that is compliant with the ANT standard, the identifier may be a device number or the like assigned to each of a plurality of communication devices 10 (without duplication) in advance.

When the trigger signal is wirelessly transmitted between carriage control unit 32 and the specific communication device 10, carriage control unit 32 performs the interlock communication, which is wireless communication to deliver transportable object 100 between carriage control unit 32 and the specific equipment 40, with the specific communication device 10 via carriage communication unit 33.

Alternatively, for example, after transmitting the trigger signal, carriage control unit 32 may start the interlock communication by receiving a response signal indicating that the trigger signal including an identifier that identifies the communication device 10 is received from the specific communication device 10, via carriage communication unit 33.

Carriage control unit 32 is implemented, for example, by the program stored in the memory included in transport carriage 30 being executed by the processor included in transport carriage 30.

Communication device 10 includes communication unit 12 and control unit 13.

Communication unit 12 communicates with transport carriage 30 and equipment 40. Communication unit 12 wirelessly communicates with transport carriage 30 and communicates in a wired manner with equipment 40 via a hard-wired cable.

Control unit 13 controls communication device 10.

Control unit 13 stores an identifier that uniquely identifies communication device 10 including the communication device itself. In other words, a plurality of communication devices 10 each have an identifier that uniquely identifies each communication device 10 in respective control units 13.

When the trigger signal is received from transport carriage 30 via communication unit 12, control unit 13 specifies transport carriage 30 as a communication partner upon verifying that a stored identifier is included in the trigger signal. Based on the specification, control unit 13 then performs the interlock communication, which is wireless communication to deliver transportable object between transport carriage 30 and equipment 40 connected to communication device 10, with transport carriage 30 via communication unit 12.

Alternatively, for example, upon verifying that a stored identifier is included in the received trigger signal, control unit 13 may transmit, to transport carriage 30, a response signal indicating that the trigger signal including an identifier that identifies the communication device 10 is received via communication unit 12.

Control unit 13 is implemented, for example, by the program stored in the memory included in communication device 10 being executed by the processor included in communication device 10.

Operation of transport system 1 thus configured will now be described.

Transport system 1 performs an interlock communication start process to start the interlock communication to deliver transportable object 100 between equipment 40 and transport carriage 30.

Figure 4:
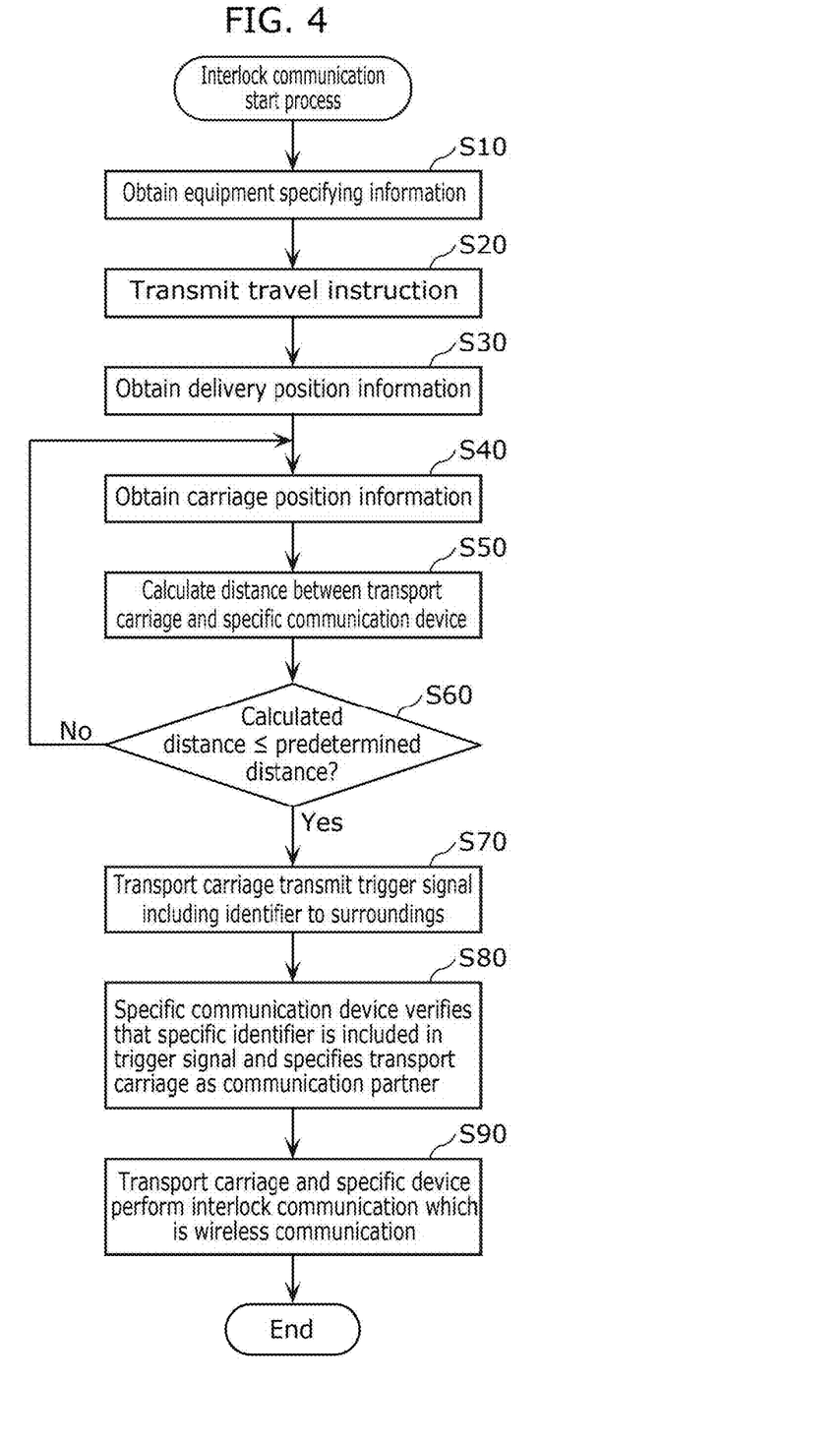
FIG. 4 is a flow chart of an interlock communication start process according to Preferred Embodiment 1 of the present invention.

FIG. 4 is a flow chart of an interlock communication start process.

The interlock communication start process is started, for example, when transport system 1 is activated.

Once the interlock communication start process is started, controller 20 obtains equipment specifying information to specify equipment 40 to which transport carriage 30 is to deliver transportable object 100 from an external device (step S10).

Once the equipment specifying information is obtained, controller 20 transmits a travel instruction to transport carriage 30 instructing it to travel to the position of the specific equipment 40 specified in obtained equipment specifying information (step S20).

Once the travel instruction is transmitted, transport carriage 30 obtains delivery position information indicating the position of the specific equipment 40 to which transport carriage 30 is to deliver transportable object 100, by receiving the travel instruction (step S30).

Once the delivery position information is obtained, transport carriage 30 obtains carriage position information indicating the current position of its own (transport carriage 30) (step S40).

Once the carriage position information is obtained, transport carriage 30 calculates a distance between transport carriage 30 and the specific communication device 10 connected to the specific equipment 40 based on the obtained delivery position information and the obtained carriage position information (step S50).

Once the distance between transport carriage 30 and the specific communication device 10 is calculated, transport carriage 30 determines whether the calculated distance is less than or equal to a predetermined distance (step S60).

If the calculated distance is not less than or equal to a predetermined distance in the process of step S60 (step S60: No), transport system 1 proceeds to step S40 again.

If the calculated distance is less than or equal to a predetermined distance in the process of step S60 (step S60: Yes), transport carriage 30 sets the operation mode of carriage communication unit 33 to the master station mode, and wirelessly transmits a trigger signal including a specific identifier that identifies communication device 10 associated with the specific equipment 40 to surroundings, the trigger signal being for starting the interlock communication, which is wireless communication to deliver transportable object 100 between transport carriage 30 and the specific equipment 40 (step S70).

Once the trigger signal is transmitted, the specific communication device 10 receives the trigger signal, and verifies that a specific identifier (for example, SSID or the like) is included in the received trigger signal, and then specifies transport carriage 30 as a communication partner (step S80).

Once the specific communication device 10 specifies transport carriage 30 as the communication partner, transport carriage 30 and the specific communication device 10 perform the interlock communication, which is wireless communication to deliver transportable object 100 between transport carriage 30 and the specific equipment 40 (step S90).

When the process of step S90 is completed, transport system 1 ends the interlock communication start process.

As described above, in transport system 1 thus configured, in the interlock communication start process, when the distance between transport carriage 30 and the specific communication device 10 is less than or equal to a predetermined distance, transport carriage 30 transmits a trigger signal to start wireless communication between transport carriage 30 and the specific communication device 10 of a plurality of communication devices 10. Accordingly, a plurality of communication devices 10 do not need to transmit a trigger signal to start the wireless communication. As a result, mutual interference of trigger signals caused by a plurality of communication devices 10 each transmitting a trigger signal does not occur. In this way, according to transport system 1 thus configured, it is possible to reduce or prevent the occurrence of communication failure.

Preferred Embodiment 2

Transport system according to Preferred Embodiment 2, which is partially-modified transport system 1 according to Preferred Embodiment 1, will now be described.

Transport system 1 according to Preferred Embodiment 1 has been an example configured such that transport carriage transmits a trigger signal. In contrast, a transport system according to Preferred Embodiment 2 is an example configured such that the specific communication device transmits a trigger signal.

Figure 5:
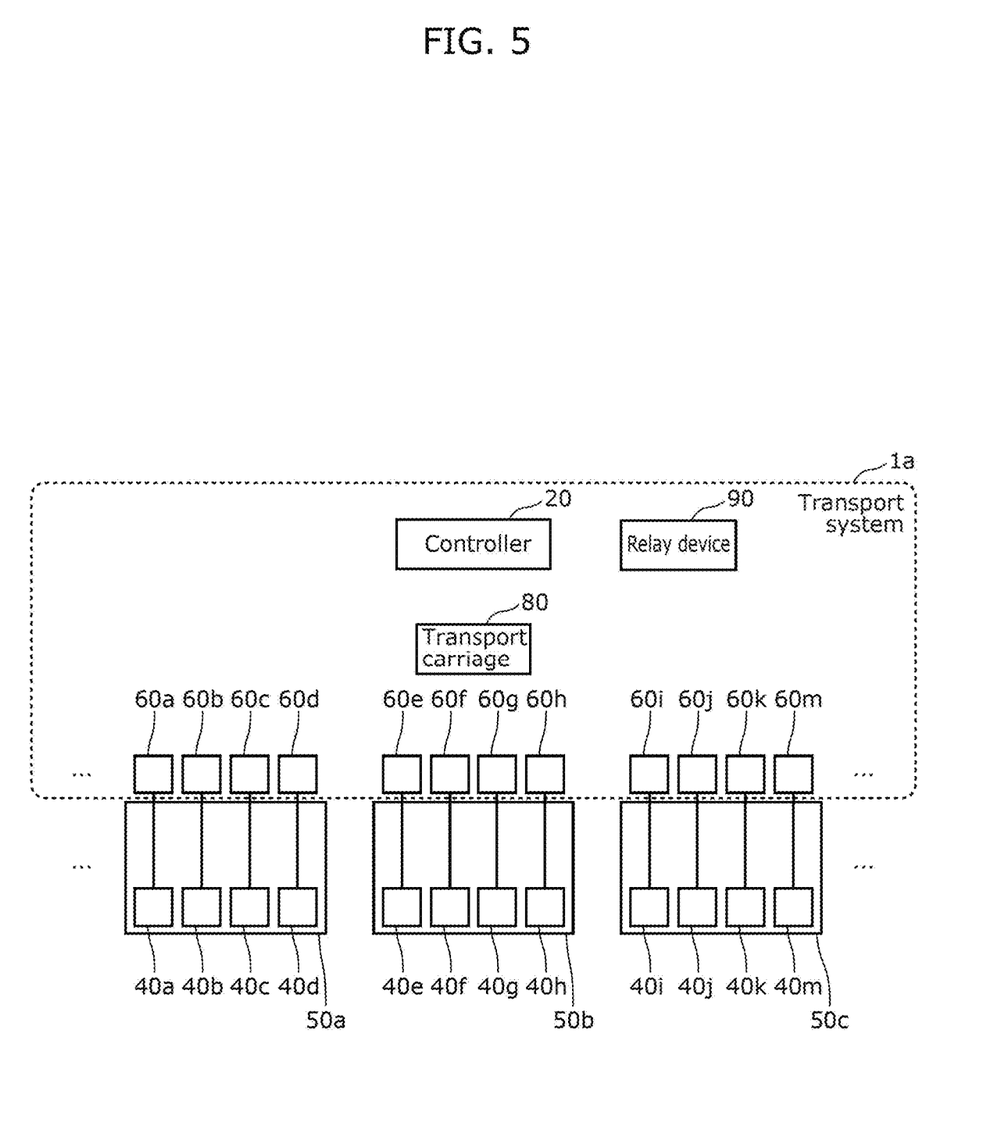
FIG. 5 is a configuration diagram of a transport system according to Preferred Embodiment 2 of the present invention.

FIG. 5 is a configuration diagram of transport system 1a according to Preferred Embodiment 2.

As illustrated in FIG. 5, in comparison with transport system 1 according to Preferred Embodiment 1, transport system 1a is configured such that transport carriage according to Preferred Embodiment 1 is replaced by transport carriage 80, communication devices 10a to 10k and 10m according to Preferred Embodiment 1 are replaced by communication devices 60a to 60k and 60m, respectively, and relay device 90 is added.

As with Preferred Embodiment 1, communication devices 60a to 60k and 60m are hereinafter referred to as communication device 60 unless it is necessary to explicitly distinguish each of them individually for explanation.

Relay device 90 relays wireless communication between transport carriage 80 and communication device 60. Relay device 90 may be, for example, an access point.

Focusing on differences from transport system 1 according to Preferred Embodiment 1, components of transport system 1a will now be described in detail.

Figure 6:
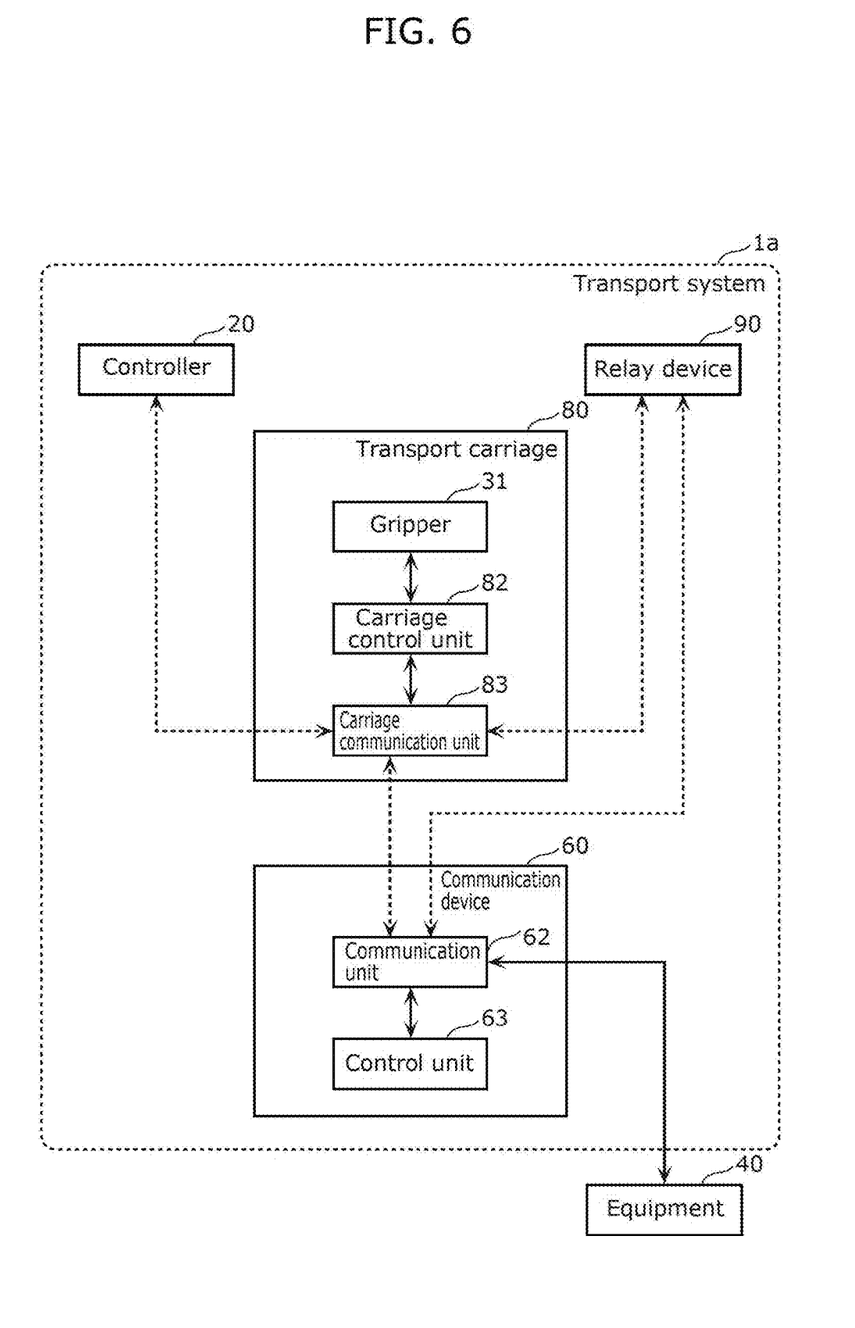
FIG. 6 is a block diagram illustrating a functional configuration of a transport system according to Preferred Embodiment 2 of the present invention.

FIG. 6 is a block diagram illustrating a functional configuration of a transport system 1a.

As illustrated in FIG. 6, from transport carriage 30 according to Preferred Embodiment 1, transport carriage 80 is configured such that carriage control unit 32 is replaced by carriage control unit 82, and carriage communication unit 33 is replaced by carriage communication unit 83.

Carriage communication unit 83 communicates with communication device 60, relay device 90, and controller 20. Carriage communication unit 83 wirelessly communicates with communication device 60 and relay device 90, and communicates with controller 20 in a contactless manner by using a leaky feeder line.

In contrast to carriage communication unit 33 according to Preferred Embodiment 1, carriage communication unit 83 does not need to have the master station mode to transmit a trigger signal for the operation mode to the outside.

As with carriage control unit 32 according to Preferred Embodiment 1, carriage control unit 82 obtains carriage position information of its own, obtains delivery position information, calculates the distance between transport carriage 80 and a specific communication device 60 connected to the specific equipment 40, and determines whether the calculated distance is less than or equal to a predetermined distance.

When it is determined that the calculated distance is less than or equal to a predetermined distance, carriage control unit 82 wirelessly transmits, to the specific communication device 60, via carriage communication unit 83 through relay device 90, a transmission instruction instructing the specific communication device 60 to transmit a trigger signal.

Carriage control unit 82 receives a trigger signal transmitted from any of a plurality of communication devices 60 via carriage communication unit 83.

Carriage control unit 82 stores correspondence information indicating correspondence between a plurality of communication devices 60 and a plurality of identifiers (for example, SSID or the like) to uniquely identify each of a plurality of communication devices 60.

Upon receipt of a trigger signal including a specific identifier that identifies the specific communication device from the specific communication device 60 via carriage communication unit 83, carriage control unit 82 specifies the specific communication device 60 as a communication partner based on the specific identifier and the correspondence information. According to the specification result, carriage control unit 82 performs the interlock communication, which is wireless communication to deliver transportable object 100 between carriage control unit 82 and the specific equipment 40, with the specific communication device 60 via carriage communication unit 83.

Alternatively, for example, upon verifying that an identifier that identifies the specific communication device is included in the received trigger signal, carriage control unit 82 may transmit, to the specific communication device 60, a response signal indicating that the trigger signal including the specific identifier is received.

As with carriage control unit 32 according to Preferred Embodiment 1, carriage control unit 82 is implemented, for example, by the program stored in the memory included in transport carriage 80 being executed by the processor included in transport carriage 80.

From communication device 10 according to Preferred Embodiment 1, communication device 60 is configured such that communication unit 62 takes over communication unit 12, and control unit 63 takes over control unit 13.

Communication unit 62 communicates with transport carriage 80, relay device 90, and equipment 40. Communication unit 62 wirelessly communicates with transport carriage 80 and relay device 90, and communicates with equipment 40 via a hard-wired cable.

Communication unit 62 preferably includes at least two operation modes: a master station mode in which communication unit 62 transmits a trigger signal (for example, beacon, pairing signal) to the outside; and a slave station mode in which communication unit 62 does not transmit a trigger signal to the outside. The operation mode of communication unit 62 is set to either the master station mode or the slave station mode by control unit 63. The operation mode of communication unit 62 is normally set to the slave station mode except in a special time period when a predetermined condition is met.

Control unit 63 controls communication device 60.

Control unit 63 stores an identifier that uniquely identifies communication device 60 including the communication device itself. In other words, a plurality of communication devices 60 each have an identifier that uniquely identifies each communication device 60 in respective control units 63.

Upon receipt of a transmission instruction from transport carriage 80 via relay device 90 through communication unit 62, control unit 63 sets the operation mode of communication unit 62 to the master station mode. Control unit 63 then wirelessly transmits a trigger signal to start the interlock communication, which is wireless communication, between transport carriage 30 and equipment 40 connected to communication device 60 including the communication device itself, via communication unit 62 to surroundings. At this time, control unit 63 transmits a stored identifier by including it in the trigger signal.

When the trigger signal is wirelessly transmitted between control unit 63 and transport carriage 80, control unit 63 performs the interlock communication, which is wireless communication to deliver transportable object 100 between transport carriage 80 and equipment 40 connected to communication device 60 including control unit 63 itself, with transport carriage 80 via communication unit 62.

Alternatively, for example, after the trigger signal is transmitted, control unit 63 may start the interlock communication by receiving a response signal indicating that the trigger signal including the specific identifier is received from transport carriage 80 via communication unit 62.

Control unit 63 is implemented, for example, by the program stored in the memory included in communication device 60 being executed by the processor included in communication device 60.

Operation of transport system 1a thus configured will now be described.

Transport system 1a performs an interlock communication start process to start the interlock communication to deliver transportable object 100 between equipment 40 and transport carriage 80. The interlock communication start process according to Preferred Embodiment is a process partially modified from the interlock communication start process according to Preferred Embodiment 1.

Figure 7:
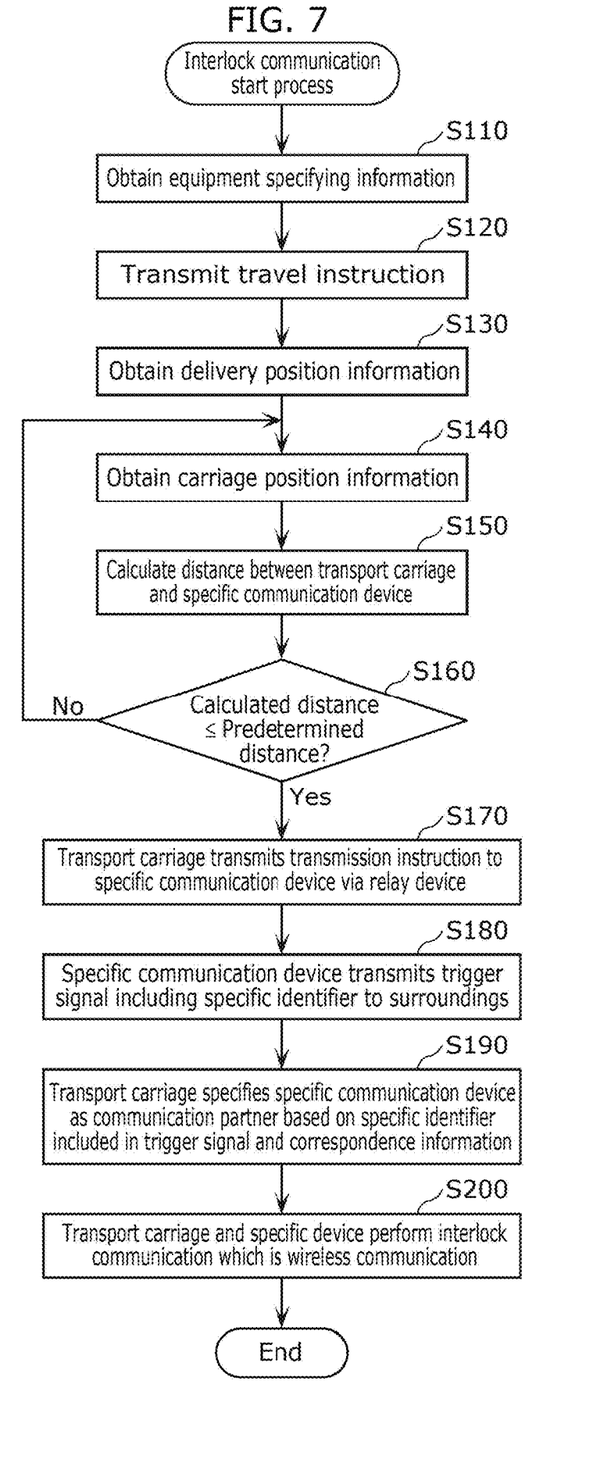
FIG. 7 is a flow chart of an interlock communication start process according to Preferred Embodiment 2 of the present invention.

FIG. 7 is a flow chart of an interlock communication start process according to Preferred Embodiment 2.

In the interlock communication start process, the processes of steps S110 to S160 are similar to steps S10 to S60 of the interlock communication start process according to Preferred Embodiment 1, except communication device 10, transport carriage 30, and transport system 1 are replaced by communication device 60, transport carriage 80, and transport system 1a, respectively. Accordingly, description of the processes of steps S110 to S160 will not be repeated as they have already been described, and the processes of steps S170 to S200 will mainly be described here.

In the process of step S160, when the calculated distance is less than or equal to a predetermined distance (step S160: Yes), transport carriage 80 wirelessly transmits transmission instruction to the specific communication device instructing it to transmit the trigger signal, via relay device 90 (step S170).

Once the transmission instruction is transmitted from transport carriage 80, the specific communication device 60 receives the transmission instruction via relay device 90, and sets the operation mode of communication unit 62 to the master station mode. The specific communication device 60 then wirelessly transmits a trigger signal including a specific identifier that identifies the specific communication device 60 to surroundings, the trigger signal being for starting the interlock communication, which is wireless communication between transport carriage 30 and equipment 40 connected to the specific communication device 60 (step S180).

Once the trigger signal is transmitted, transport carriage 80 receives the trigger signal and specifies the specific communication device 10 as a communication partner based on the specific identifier included in the trigger signal and the stored correspondence information (step S190).

Once transport carriage 80 specifies the specific communication device 60 as the communication partner, transport carriage 80 and the specific communication device perform the interlock communication, which is wireless communication to deliver transportable object 100 between transport carriage 80 and the specific equipment 40 (step S200).

When the process of step S200 is completed, transport system 1a ends the interlock communication start process.

As described above, in transport system 1a thus configured, in the interlock communication start process, when the distance between transport carriage 80 and the specific communication device 60 is less than or equal to a predetermined distance, one specific communication device 60 of a plurality of communication devices 60 transmits the trigger signal. Accordingly, other communication devices 60 do not need to transmit a trigger signal. As a result, mutual interference of trigger signals caused by a plurality of communication devices 60 transmitting trigger signals does not occur. In this way, according to transport system 1a thus configured, it is possible to reduce or prevent the occurrence of communication failure.

Other Preferred Embodiments

Control methods, transport systems, and communication devices according to the present invention have been described above based on Preferred Embodiment 1 and Preferred Embodiment 2. However, the present invention is not limited to the Preferred embodiments. Various modifications applied to the preferred embodiments and those constructed by combining components in different preferred embodiments, which may occur to those skilled in the art, without departing from the spirit of the present invention are also within the scope of the present invention.

In the descriptions of Preferred Embodiment 1 and Preferred Embodiment 2 above, the transport system is configured such that the transport carriage calculates the distance between the transport carriage and the specific communication device based on the delivery position information and its own carriage position information, and the transport carriage determines whether the calculated distance is less than or equal to a predetermined distance. Alternatively, however, a transport system according to a preferred embodiment of the present invention may be configured such that any one of the transport carriage, the specific communication device, and the controller calculates the distance between the transport carriage and the specific communication device based on the delivery position information and the carriage position information, and any one of the transport carriage, the specific communication device, and the controller determines whether the calculated distance is less than or equal to a predetermined distance.

For example, the calculation of the distance between the transport carriage and the specific communication device by the controller based on the delivery position information and the carriage position information can be performed by, for example, the controller receiving the carriage position information from the transport carriage by using contactless communication with a leaky feeder line or superimposed communication in which a signal is superimposed on a litz wire.

For example, the calculation of the distance between the transport carriage and the specific communication device by the specific communication device based on the delivery position information and the carriage position information can be performed by, for example, the specific communication device receiving the delivery position information from the controller by wireless communication via the relay device, and for example, the specific communication device receiving the carriage position information from the transport carriage by wireless communication via the relay device.

For example, the determination of whether the calculated distance is less than or equal to a predetermined distance by the specific communication device when the transport carriage calculates the distance between the transport carriage and specific communication device can be performed by, for example, the specific communication device receiving information indicating the calculated distance from the transport carriage by wireless communication relayed by the relay device.

For example, the determination of whether the calculated distance is less than or equal to a predetermined distance by the specific communication device when the specific communication device calculates the distance between the transport carriage and the specific communication device can be performed by the specific communication device using the calculated distance as it is calculated.

For example, the determination of whether the calculated distance is less than or equal to a predetermined distance by the controller when the controller calculates the distance between the transport carriage and the specific communication device can be performed by the controller using the calculated distance as it is calculated.

In view of this, in addition to transport system 1 described in Preferred Embodiment 1 and transport system 1a described in Preferred Embodiment 2, transport systems 1b to 1e described below may be conceivable as examples of transport systems according to preferred embodiments of the present invention, for example.

In transport system 1b (not illustrated) according to a preferred embodiment of the present invention, for example, the transport carriage calculates the distance between the transport carriage and the specific communication device based on the delivery position information and the carriage position information, the specific communication device determines whether the calculated distance is less than or equal to a predetermined distance, and the specific communication device transmits the trigger signal.

In transport system 1c (not illustrated) according to a preferred embodiment of the present invention, for example, the specific communication device calculates the distance between the transport carriage and the specific communication device based on the delivery position information and the carriage position information, the specific communication device determines whether the calculated distance is less than or equal to a predetermined distance, and the specific communication device transmits the trigger signal.

In transport system 1d (not illustrated) according to a preferred embodiment of the present invention, for example, the controller calculates the distance between the transport carriage and the specific communication device based on the delivery position information and the carriage position information, the controller determines whether the calculated distance is less than or equal to a predetermined distance, and the transport carriage transmits the trigger signal.

In transport system 1e (not illustrated) according to a preferred embodiment of the present invention, for example, the controller calculates the distance between the transport carriage and the specific communication device based on the delivery position information and the carriage position information, the controller determines whether the calculated distance is less than or equal to a predetermined distance, and the specific communication device transmits the trigger signal.

In Preferred Embodiment 1, the equipment connected to each communication device 10 on a one-to-one basis is exemplified by a configuration of a load port onto which transportable object 100 is to be loaded, but is not limited to such. For example, the equipment may be semiconductor manufacturing apparatus 50. In other words, each of a plurality of communication devices 10 may be connected to each of a plurality of semiconductor manufacturing apparatuses 50 one by one, and one communication device 10 may be responsible for a plurality of load ports.

Alternatively, for example, the equipment may be a group of semiconductor manufacturing apparatuses 50 on the basis of a collection of a plurality of semiconductor manufacturing apparatuses 50 as one unit. In other words, each of a plurality of communication devices 10 may be connected to each of plural groups of semiconductor manufacturing apparatuses 50 one by one, and one communication device 10 may be responsible for a plurality of semiconductor manufacturing apparatuses 50.

Alternatively, for example, the equipment may be a group of load ports on the basis of a collection of a plurality of load ports as one unit. Specifically, each of a plurality of communication devices 10 may be connected to each of plural groups of load ports one by one. In other words, one communication device 10 may be connected to a collection of a plurality of load ports one by one.

Furthermore, for example, the equipment need not be a load port associated with a semiconductor manufacturing, semiconductor manufacturing apparatus 50, or the like. For example, the equipment may be anything unrelated to the semiconductor manufacturing, such as a table.

The steps in the interlock communication start process in Preferred Embodiment 1 and the interlock communication start process in Preferred Embodiment 2 may be executed by a computer (computer system). Then, various preferred embodiments of the present invention may be realized as a program or programs to cause a computer to execute the steps included in the interlock communication start process in Preferred Embodiment 1 and the interlock communication start process in Preferred Embodiment 2. In addition, various preferred embodiments of the present invention may be realized as a non-transitory computer-readable recording medium, such as a CD-ROM, on which the program(s) is recorded.

For example, when various preferred embodiments of the present invention are realized as a program(s) (software), the respective steps are executed by the program(s) being executed using the hardware resources of the computer such as a CPU, memory, input/output circuit, and the like. Specifically, the respective steps are executed by the CPU obtaining data from the memory or input/output circuit, etc., performing arithmetic operations on the data, and outputting the results of the arithmetic operations to the memory or input/output circuit, etc.

In Preferred Embodiment 1, each of the structural components included in transport system 1 may be implemented as a dedicated or general-purpose circuit. These structural components may be implemented as a single circuit or may be implemented as a plurality of circuits.

Furthermore, the structural components included in transport system 1 may be implemented as a large scale integration (LSI) which is an integrated circuit (IC). These structural components may take the form of individual chips, or one or more or all of the structural components may be encapsulated into a single chip. The LSI may be referred to as a system LSI, a super LSI, or an ultra LSI depending on the scale of integration.

Furthermore, aside from an LSI, the integrated circuit may be implemented by a dedicated circuit or a general-purpose processor. As described above, it is also possible to use an FPGA that can be programmed, or a reconfigurable processor in which connection and setting of circuit cells in an LSI can be reconfigured.

In addition, when a circuit integration technology that replaces LSIs comes along owing to advances of the semiconductor technology or to a separate derivative technology, the respective structural components included in transport system 1 may be understandably integrated using that technology.

Other forms obtained through various modifications to Preferred Embodiment 1 and Preferred Embodiment 2 conceived by a person of ordinary skill in the art or forms realized through an arbitrary combination of the components in the respective preferred embodiments described above, so long as they do not depart from the essence of the present invention, are included in the present invention.

Preferred embodiments of the present invention can be used in transport systems or the like to perform an interlock communication process by wireless communication.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A control method of a transport system, the transport system including a transport carriage to transport a transportable object, a plurality of communication devices respectively connected to a plurality of equipment to which the transportable object is to be delivered, a controller to control travel of the transport carriage, and a relay device to relay wireless communication between the transport carriage and the plurality of communication devices, the control method comprising:
   obtaining, by the controller, equipment specifying information that specifies a specific equipment of the plurality of equipment to which the transport carriage is to deliver the transportable object;
   obtaining, by the transport carriage, carriage position information indicating a position of the transport carriage;
   calculating, by any one of the transport carriage, a specific communication device of the plurality of communication devices which is connected to the specific equipment specified in the equipment specifying information, and the controller, a distance between the transport carriage and the specific communication device based on delivery position information indicating a position of the specific equipment and the carriage position information;
   determining, by any one of the transport carriage, the specific communication device, and the controller, whether the distance is less than or equal to a predetermined distance;
   transmitting, by one of the transport carriage and the specific communication device, a trigger signal wirelessly to surroundings, when the distance is less than or equal to a predetermined distance, the trigger signal being a signal to start wireless communication between the transport carriage and the specific equipment; and
   performing, by the transport carriage and the specific equipment, wireless communication to deliver the transportable object between the transport carriage and the specific equipment, when the trigger signal is communicated wirelessly between the transport carriage and the specific equipment; wherein
   the control method further comprises:
   obtaining, by the transport carriage, the delivery position information by receiving, from the controller, a travel instruction instructing travelling up to the position of the specific equipment;
   the calculating of the distance includes calculating, by the transport carriage, the distance based on the delivery position information obtained and the carriage position information;
   the determining includes determining, by the transport carriage, whether the distance is less than or equal to the predetermined distance;
   the control method further comprises:
   transmitting, by the transport carriage, a transmission instruction wirelessly to the specific communication device via the relay device, when the distance is determined to be less than or equal to the predetermined distance, the transmission instruction instructing transmission of the trigger signal; and
   the transmitting of the trigger signal includes transmitting, by the specific communication device, the trigger signal wirelessly to the surroundings, when the transmission instruction is received.

2. The control method according to claim 1, wherein
   the transmitting of the trigger signal includes transmitting, by the transport carriage, the trigger signal wirelessly to the surroundings, when the distance is determined to be less than or equal to the predetermined distance.

3. The control method according to claim 2, wherein
   the plurality of communication devices each store an identifier that uniquely identifies the communication device;
   the transmitting of the trigger signal includes transmitting, by the transport carriage, the trigger signal including a specific identifier that identifies the specific communication device, to the surroundings; and
   the performing of the wireless communication includes:
   specifying, by the specific communication device, the transport carriage as a communication partner by verifying that the specific identifier is included in the trigger signal; and
   performing, by the transport carriage and the specific communication device, the wireless communication based on the specifying.

4. The control method according to claim 1, wherein
   the plurality of communication devices each store an identifier that uniquely identifies the respective communication device;
   the transport carriage stores correspondence information indicating correspondence between the plurality of communication devices and the identifiers;
   the transmitting of the trigger signal includes transmitting, by the specific communication device, the trigger signal including a specific identifier that identifies the specific communication device, wirelessly to the surroundings; and
   the performing of the wireless communication includes:
   specifying, by the transport carriage, the specific communication device as a communication partner based on the specific identifier included in the trigger signal and the correspondence information; and
   performing, by the transport carriage and the specific communication device, the wireless communication based on the specifying.

5. A transport system, comprising:
   a transport carriage to transport a transportable object;
   a plurality of communication devices respectively connected to a plurality of equipment to which the transportable object is to be delivered;
   a controller to control travel of the transport carriage; and
   a relay device that relays wireless communication between the transport carriage and the plurality of communication devices; wherein
   the controller is configured or programmed to obtain equipment specifying information specifying a specific equipment of the plurality of equipment to which the transport carriage is to deliver the transportable object;
   the transport carriage is configured or programmed to obtain carriage position information indicating the position of the transport carriage;
   any one of the transport carriage, a specific communication device of the plurality of communication devices which is connected to the specific equipment specified in the equipment specifying information, and the controller is configured or programmed to calculate a distance between the transport carriage and the specific communication device based on delivery position information indicating a position of the specific equipment and the carriage position information;
   any one of the transport carriage, the specific communication device, and the controller is configured or programmed to determine whether the distance is less than or equal to a predetermined distance;

one of the transport carriage and the specific communication device is configured or programmed to transmit a trigger signal wirelessly to surroundings, when the distance is less than or equal to a predetermined distance, the trigger signal being a signal to start wireless communication between the transport carriage and the specific equipment;

the transport carriage and the specific equipment are configured or programmed to perform wireless communication to deliver the transportable object between the transport carriage and the specific equipment, when the trigger signal is communicated wirelessly between the transport carriage and the specific equipment;

the transport carriage obtains the delivery position information by receiving, from the controller, a travel instruction instructing travelling up to the position of the specific equipment;

the transport carriage calculates the distance based on the delivery position information obtained and the carriage position information;

the transport carriage determines whether the distance is less than or equal to the predetermined distance;

the transport carriage transmits a transmission instruction wirelessly to the specific communication device via the relay device, when the distance is determined to be less than or equal to the predetermined distance, the transmission instruction instructing transmission of the trigger signal; and the specific communication device transmits the trigger signal wirelessly to the surroundings, when the transmission instruction is received.

6. The transport system according to claim 5, wherein the transport carriage transmits the trigger signal wirelessly to the surroundings, when the distance is determined to be less than or equal to the predetermined distance.

7. The transport system according to claim 6, wherein the plurality of communication devices each store an identifier that uniquely identifies the communication device;

the transport carriage transmits, to the surroundings, the trigger signal including a specific identifier that identifies the specific communication device; and the specific communication device specifies the transport carriage as a communication partner by verifying that the specific identifier is included in the trigger signal, and the transport carriage and the specific communication device perform the wireless communication based on the specifying.

8. The transport system according to claim 5, wherein the plurality of communication devices each store an identifier that uniquely identifies the communication device;

the transport carriage stores correspondence information indicating correspondence between the plurality of communication devices and the identifiers;

the specific communication device transmits, wirelessly to the surroundings, the trigger signal including a specific identifier that identifies the specific communication device; and the transport carriage specifies the specific communication device as a communication partner based on the specific identifier included in the trigger signal and the correspondence information, and the transport carriage and the specific communication device perform the wireless communication based on the specifying.

9. A communication device connected to a specific equipment to which a transportable object is to be delivered, the communication device being configured or programmed to transmit, wirelessly to surroundings, a trigger signal to start wireless communication between a transport carriage to transport the transportable object and the specific equipment, when a transmission instruction instructing transmission of the trigger signal is received from the transport carriage via a relay device that relays wireless communication between the transport carriage and the communication device; wherein the communication device is configured or programmed to:

store an identifier that uniquely identifies the communication device;

when transmitting the trigger signal, wirelessly transmit to the surroundings, the trigger signal including the identifier stored; and when the transport carriage specifies the communication device as a communication partner based on the identifier included in the trigger signal received, perform, with the transport carriage, wireless communication to deliver the transportable object between the transport carriage and the specific equipment.

* * * * *